United States Patent [19]

Suzuki et al.

[11] 3,992,635

[45] Nov. 16, 1976

[54] N SCALE COUNTER

[75] Inventors: Yasoji Suzuki, Ayase; Kenshi Manabe, Yokohama; Teruaki Tanaka, Yokohama; Tomohisa Shigematsu, Yokohama, all of Japan

[73] Assignee: Tokyo Shibaura Electric Co., Ltd., Kawasaki, Japan

[22] Filed: Nov. 17, 1975

[21] Appl. No.: 632,575

[30] Foreign Application Priority Data

Nov. 18, 1974 Japan............................. 49-132092

[52] U.S. Cl. ........................ 307/225 C; 307/221 C; 307/223 C; 328/48

[51] Int. Cl.² .................. H03K 21/02; H03K 23/30

[58] Field of Search ........ 307/225 R, 221 C, 225 C, 307/223 C; 328/48, 37, 42, 41, 43

[56] References Cited

UNITED STATES PATENTS

| | | | |
|---|---|---|---|
| 2,853,238 | 9/1958 | Johnson............................. | 328/42 X |
| 3,363,115 | 1/1968 | Stephenson et al............. | 307/221 C |
| 3,548,203 | 12/1970 | Basse et al. ..................... | 307/225 R |
| 3,621,280 | 11/1971 | Ma.................................. | 307/225 C |

*Primary Examiner*—John S. Heyman
*Attorney, Agent, or Firm*—Oblon, Fisher, Spivak, McClelland and Maier

[57] ABSTRACT

An n scale counter includes a shift register having X number of unit delay circuits connected in series and each consisting of a plurality of insulated gate field effect transistors. The unit delay circuits of the shift register are simultaneously supplied with pulses to be counted and each of the delay cicuits is set or reset to an initial state. There is also provided a closed loop circuit including a first gate circuit connected to receive an output signal from the last stage delay circuit as one input terminal, and a logic circuit connected to receive output signals from the first gate circuit and, for example, the first stage delay circuit and produce to the input terminal of the first stage delay circuit an output signal indicating coincidence or incoincidence of its input signals. The counter is capable of counting pulses of $(2^x-1)$ at maximum. A second gate circuit is provided to apply its output signal to the other input terminal of the first gate circuit and output signals of a predetermined combination from the unit delay circuits are supplied to the second gate circuit so that the counter can function as a counter with a counting capacity smaller than that of $(2^x-1)$.

8 Claims, 10 Drawing Figures

N SCALE COUNTER

This invention relates to an n scale counter including insulated gate field effect transistors, and more particularly to an n scale counter with a large counting capacity constructed by a small number of elements.

In the prior art, there have been various kinds of counter including a binary counter. The binary counter is provided with a plurality of flip-flop circuits connected in series and divides the frequency of the input pulses into halves at each stage to count the number of pulses applied to the first stage flip-flop circuit. When, for example, a 40 scale counter is formed, six flip-flop circuits are connected in series and the counter is so designed that each flipflop circuit may automatically be reset to the initial state to prepare for the next counting operation when a predetermined number of input pulses have been counted.

The binary counter has a disadvantage that since the output signal is the first stage flip-flop circuit is applied to the succeeding flip-flop circuits, the phase lag between the output signals from the first and last stage flip-flop circuits becomes large as the number of the flip-lfop circuits used increases. Now, let the output signals from the first to sixth stage flip-flop circuits be $\theta_1$ to $\theta_6$ and assume that the counter is made to produce a pulse when twelve input pulses have been counted. An AND gate is provided to produce an output pulse when receiving the output signals of $\bar{\theta}_1$, $\bar{\theta}_2$, $\theta_3$, $\theta_4$, and $\bar{\theta}_5$ and $\bar{\theta}_6$. As described before, however, a phase lag occurs between the output signals, causing the output pulse of the AND gate to have a very small pulse width.

The binary counter has another disadvantage described as follows. For example, when an input pulse signal of 10 KHz is applied to the first stage flip-flop circuit, pulse signals of 5 KHz and 2.5 KHz are obtained as input pulse signals to the second and third stage flip-flop circuits, respectively. In general, insulated gate field effect transistors are used to form the flip-flop circuits of dynamic type in which the gate capacitor of the field effect transistors can be used as temporary storages. However, the frequency of input pulses to the dynamic type flip-flop circuit has a lower limit, and so, when an input pulse of 10 KHz is used for the binary counter the first stage flip-flop circuit can be formed of a dynamic type flip-flop circuit but the succeeding stage flip-flop circuits must be formed of a static type flip-flop circuit which requires more field effect transistors than the dynamic type flip-flop circuit. In the binary counter, for example, 132 field effect transistors are required to form a 40 scale counter. When a large number of insulated field effect transistors are integrated on the same semiconductor substrate to form a counter by suitably arranging the transistors, the pattern designing becomes complicated and the area occupied on the semiconductor substrate becomes large with an increase in the number of the transistors used, resulting in a low yield and high manufacturing cost.

In order to prevent the counter output pulse from having a small pulse width due to the occurrence of phase lag between output pulses of the flip-flop circuits, there is provided a synchronous counter in which a plurality of J–K flip-flop circuits are connected in series and input pulses or clock pulses are applied in parallel to the J–K flip-flop circuits. With the synchronous counter, the occurrence of phase lag between the ouput pulses of the J–K flip-flop circuits is prevented. However, this counter requires a large number of J–K flip-flop circuits and, for example, 39 J–K flip-flop circuits are required to form a 40 scale counter.

Therefore, an object of this invention is to provide an n scale counter which can be formed of a small number of unit delay circuits, has a large counting capacity and produces an output pulse with a sufficiently large pulse width.

An n scale counter according to this invention comprises a shift register including a plurality of unit delay circuits connected in series which are formed of a plurality of insulated gate field effect transistors and to which pulses to be counted are supplied in parallel, a set-reset means for setting at least one of said unit delay circuits and resetting the remaining unit delay circuits to set said shift register into the initial state, and a closed loop circuit connected to receive output signal from the last stage unit delay circuit and a selected one of said unit delay circuits and to apply to the first stage unit delay circuit an output signal which causes the first stage unit delay circuit to produce an output signal inverted when the last stage delay circuit produces a 0 level output and an output signal which causes the first stage unit delay circuit to produce an output signal non-converted when the last stage unit delay circuit produces a 1 level output signal.

According to this invention, a counter having a counting capacity of $(2^x-1)$ at maximum can be formed of an x number of unit delay circuits. Unlike the binary counter, the unit delay circuits are synchronous pulse counters driven in parallel by pulses to be counted and so the counter will produce an output pulse having satisfied pulse width. Moreover, when the frequency of the input pulse used in the counter is set higher than a predetermined frequency, every stage unit delay circuit can be formed of dynamic type, reducing the number of transistors employed.

The closed loop circuit may be constructed to include a first gate circuit receiving an output signal from the last stage unit delay circuit and a signal having a constant level and a logic circuit receiving output signals from the first gate circuit and a selected one of the unit delay circuits except the last stage unit delay circuit and producing to the first stage unit delay circuit an output signal designating coincidence or incoincidence between the two output signals. Further, the closed loop circuit may be formed to include a second gate circuit arranged to receive a prescribed combination of the outputs of the unit delay circuits, a first gate circuit receiving output signals from thee first gate circuit and the last stage unit delay circuit, and a logic circuit arranged to receive output signals from the first gate circuit and said selected one of the unit delay circuits and apply to the first stage unit delay circuit an output signal indicating coincidence or incoincidence between the two output signals.

In the counter thus constructed, the prescribed combination of the outputs of the unit delay circuits can be changed into another combination so as to permit the counter to function as a counter having a counting capacity of smaller than $(2^x-1)$.

This invention can be more fully understood from the following detailed description when taken in conjunction with the accompanying drawings, in which.

Figure 1:
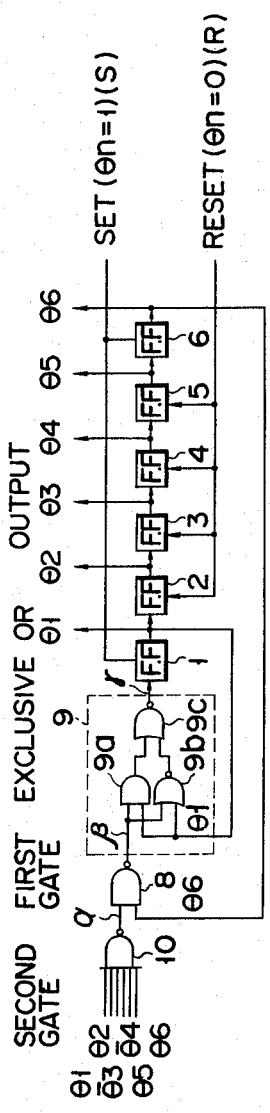
FIG. 1 is a block diagram showing a counter according to a first embodiment of this invention.

As shown in FIG. 1, a shift register includes unit delay circuits 1 to 6 (which are hereinafter referred to as "delay circuits") formed of a plurality of insulated gate field effect transistors. In the shift register, "set" signals are applied to the first and sixth stage delay circuits 1 and 6 and "reset" signals to the remaining delay circuits 2 to 5 so that the shift register is set to the initial state, that is, the first and sixth stage delay circuits are set at a 1 level and the remaining delay circuits are set at a 0 level. As is clearly understood from FIG. 2, each of the delay circuits 1 to 6 includes ten insulated gate field effect transistors and is supplied with clock pulses $\phi_1$ and $\phi_2$. $\theta_1$ to $\theta_6$ denote respective output signals of the delay circuits 1 to 6. The output signal $\theta_6$ of the sixth stage delay circuit 6 is applied to one input terminal of a first gate, for example, a NAND gate 8 and an output signal $\beta$ of the NAND gate is supplied to one input terminal of an exclusive OR circuit 9. The output signal $\theta_1$ of the first stage delay circuit 1 is supplied to the other input terminal of the exclusive OR circuit 9 whose output signal $\gamma$ is supplied to the first stage delay circuit 1. The exclusive OR circuit 9 includes an AND gate 9a and NOR gates 9b and 9c arranged as shown in FIG. 1. There is also provided a second gate circuit such as a NAND gate 10 receiving input signals, for example, $\theta_1, \theta_2, \overline{\theta}_3, \overline{\theta}_4, \theta_5$ and $\theta_6$ and producing an output signal $\alpha$ to the other input terminal of the first gate 8.

Figure 2:
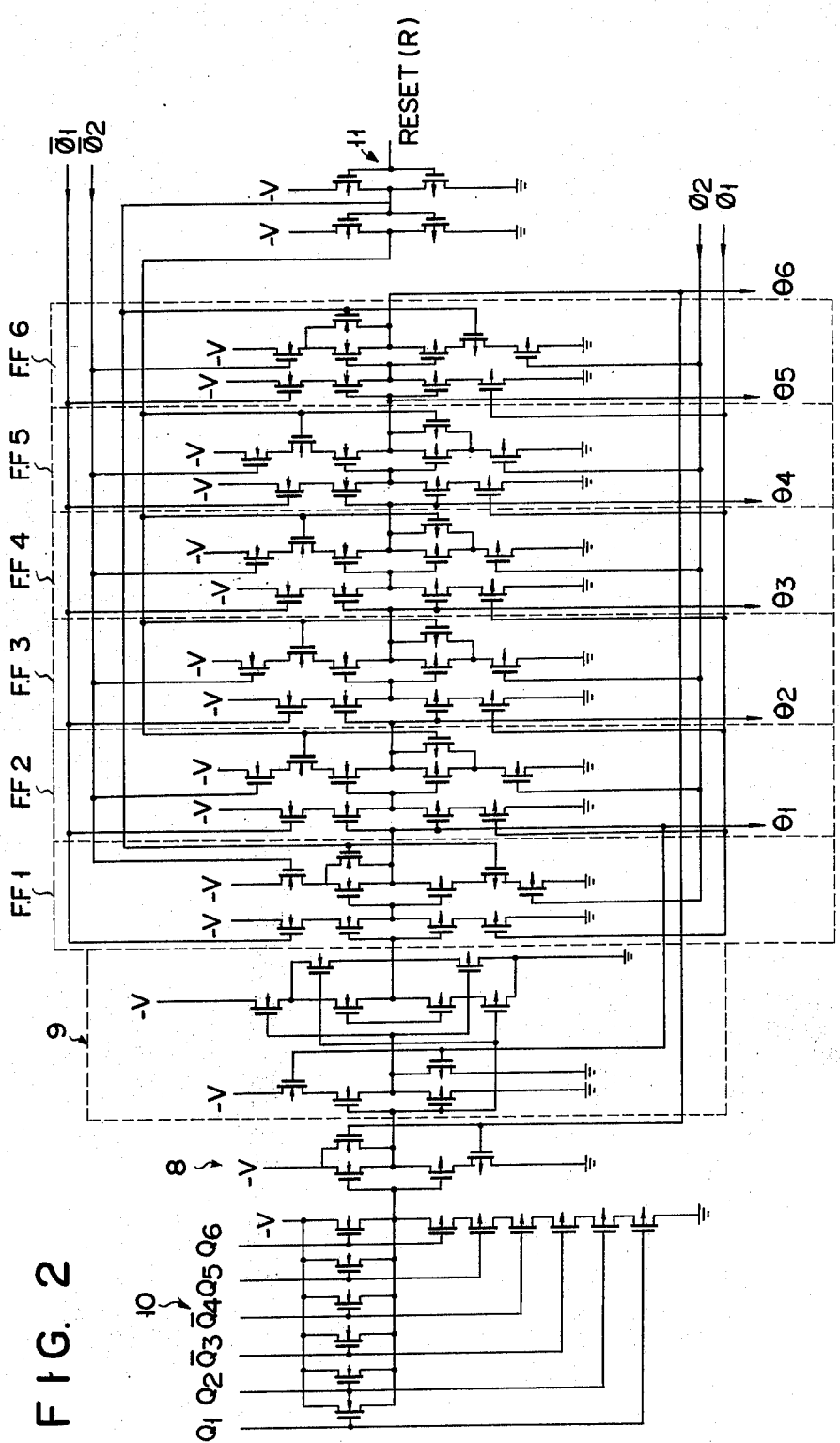
FIG. 2 shows a detailed circuit diagram of the counter shown in FIG. 1.

FIG. 2 shows the detailed connections between insulated gate field effect transistors forming the first gate 8, exclusive OR gate 9, second gate 10 and reset gate 11, a power source V and the delay circuits 1 to 6. In FIG. 2, parts corresponding to those in FIG. 1 are denoted by the same reference numerals. In FIG. 1, pulses $\phi_1$ and $\phi_2$ to be counted and an output pulse are not shown but the output pulse can be obtained as a logical product, for example, of selected ones of output signals from the delay circuits 1 to 6.

Figure 3:
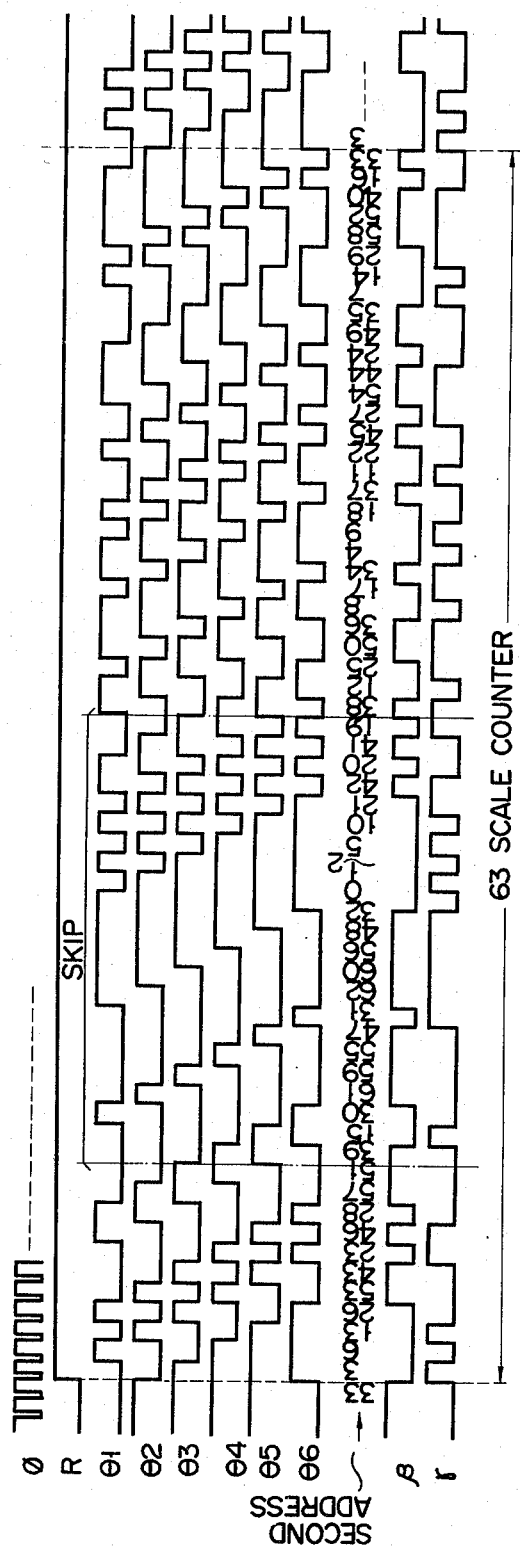
FIG. 3 is a time chart schematically explaining the operation of the counter of FIG. 1 when used as a 63 scale counter.
Figure 4:
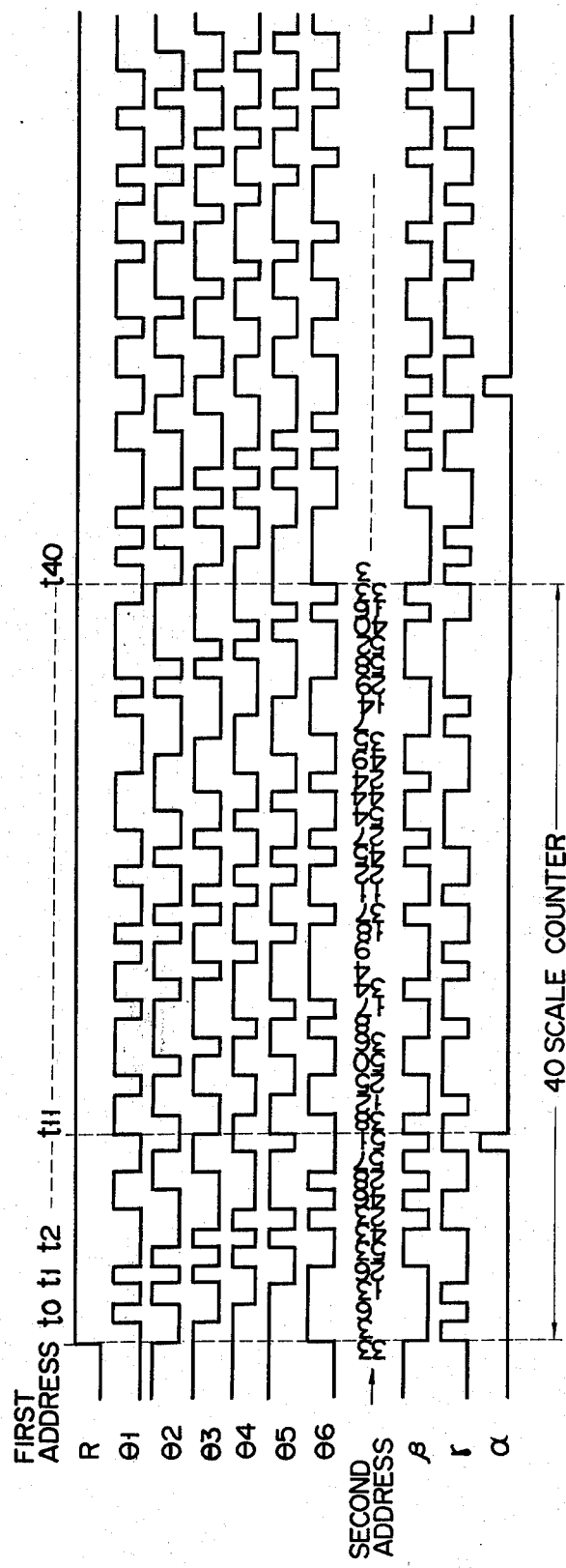
FIG. 4 is a time chart schematically explaining the operation of the counter of FIG. 1 when used as a 40 scale counter.

FIG. 3 illustrates the waveforms of signals at selected points of the counter (except the second gate circuit 10) shown in FIG. 1 when it is used as a $2^x-1$ or 63 scale counter. FIG. 4 illustrates the waveforms of signals at selected points of the counter (including the second gate circuit 10) shown in FIG. 1 when it is used as a 40 scale counter. There will now be explained the operation of the counter of FIG. 1 including the second gate circuit 10. The explanation is made on the basis of negative logic. Output signals $\theta_1, \theta_2, \theta_3, \theta_4, \theta_5, \theta_6$ represent code $1(=2^0)$, code $2(=2^1)$, code $4(=2^2)$, code $8(=2^3)$, code $16(=2^4)$ and code $32(=2^5)$, respectively. First addresses $t_0$ (which is the address when the counter is reset), $t_1 \ldots t_n$ denote time that corresponding clock pulses have been input (n is 40 in the case of 40 scale counter and 63 in the case of 63 scale counter). The clock pulse $\phi$ shown in FIG. 3 corresponds to the clock pulse $\phi_2$ in FIG. 2 and the clock pulses $\phi_1$ and $\phi_2$ are out of the phase by 180°. Second addresses represent combinations of the output signals $\theta_1$ to $\theta_6$ shown in FIG. 1. In FIGS. 3 and 4, second addresses are denoted by reference numerals 3 to 62. The combinations of $\theta_1$ to $\theta_6$ indicated by the second addresses are different from one another.

To determine the initial output state of each delay circuit, for example, the delay circuits 1 and 6 are set by a "set" signal S to set the initial state of the output signals $\theta_1$ and $\theta_6$ at 1, and the remaining delay circuits 2 to 5 are reset by a reset signal R to set the initial state of the ouput signals $\theta_2$ and $\theta_5$ at 0. The shift register including the delay circuits 1 to 6, the first gate circuit 8 (maintaining the input signal $\alpha$ at 1) and the exclusive OR circuit 9 can be combined so as to form a counter with a counting capacity of $63(=2^6-1)$ at maximum as illustrated in FIG. 3. Further, the second gate circuit 10 whose logical input requirement is determined by a suitable combination of the input signals (for example, a combination of $\theta_1, \theta_2, \overline{\theta}_3, \overline{\theta}_4, \theta_5, \theta_6$) is connected so that it may produce an output signal $\alpha$ to the first gate circuit 8 when the input requirement of the gate circuit 10 is satisfied, thereby forming a 40 scale counter functioning as shown in FIG. 4.

There will now be described, with reference to FIG. 4, the operation of the counter shown in FIG. 1 which here functions as a 40 scale counter. Since the input logical requirement of the second gate circuit 10 is not satisfied ($\alpha=1$) when the delay circuits are set and reset in the first address $t_0$, the first gate circuit 8 receiving the input signal $\theta_6(=1)$ produces an output signal $\beta(=0)$ applied to the exclusive OR circuit 9. While the delay circuits are set and reset as described before, the output signal $\theta_1$ from the first delay circuit 1 or the input signal $\theta_1$ to the exclusive OR gate 9 is at 1 level and the other input signal $\beta$ is at 0 level, and therefore an output signal $\gamma$ of the exclusive OR circuit 9 is 1. When the delay circuits 1 to 6 are free from the above mentioned initial set and reset states, or in the first address $t_1$, the first delay circuit 1 shifts the input signal $\gamma(=1)$ and produces the output signal $\theta_1(=1)$. Each of the succeeding delay circuits 2 to 6 shifts the output signal of the preceding stage delay circuit, and so at the first address $t_1$, there result $\theta_1, \theta_2 = 1$ and $\theta_3, \theta_4, \theta_5, \theta_6 = 0$. That is, the combination of $\theta_1$ to $\theta_6$ represents the code 3 of the second gate circuit 10 produces an output signal $\alpha=1$, the first gate circuit 8 inverts the signal $\theta_6$ which is at 0 level and produces the output signal $\beta(=1)$. Now, $\beta(=1)$ and $\theta_1(=1)$ are applied to the exclusive OR circuit 9 which, in turn, produces the output signal $\gamma(=0)$. At the first address $t_2$, the delay circuit 1 shifts the output signal $\gamma(=0)$ of the exclusive OR circuit 9 and produces the output signal $\theta_1(=0)$. Each of the succeeding delay circuits 2 to 6 shifts an output signal of the preceding stage delay circuit and, at the first address $t_2$, there result $\theta_1=0, \theta_2=1, \theta_3=1$ and $\theta_4$ to $\theta_6=0$, that is, the combination of $\theta_1$ to $\theta_6$ represents the code 6 of the second address. Since, at the code 6 of the second address, the gate circuit 10 is still not enabled, and $\alpha=1$ and $\theta_6=0$, the first gate circuit 8 inverts the signal $\theta_6$ applied thereto and produces an output signal $\beta=1$. The exclusive OR circuit 9 receiving $\beta(=1)$ and $\theta_1(=0)$ produces the output signal $\gamma(=1)$.

The operation as described above is continued and when a combination of output signals $\theta_1$ to $\theta_6$ applied to the second gate circuit 10 becomes equal to a prescribed combination of $\theta_1$ to $\theta_6$, for example, when a code 51 of the second address is obtained at a first address $t_{11}$, the second gate circuit 10 is enabled and produces the output signal $\alpha(=0)$. Therefore, the output signal $\beta$ of the first gate circuit 8 becomes 1 irrespective of the logical lever of the output signal $\theta_6$ from the delay circuit 6. At the first address $t_{11}$, $\theta_1$ is 1 (see FIG. 3) and $\beta$ is made equal to 1. This causes the exclusive OR circuit 9 to produce the output signal $\gamma(=0)$. If, at the code 51 of the second address, the second gate circuit 10 were not enabled, the output signals $\alpha(=1)$ and $\theta_6(=1)$ would cause $\beta$ to be 0 and the output signals $\beta(=0)$ and $\theta_1(=1)$ would cause $\gamma$ to be 1. In this example, however, as described before, the input requirement of the second gate circuit 10 is satisfied, and some second addresses are skipped. That is, as shown in FIG. 3, second addresses 39 to 19 are skipped and the operation is continued from a second address 38. Exception of the addresses 39 to 19 skipped in FIG. 3 changes the function of a 63 scale counter into the function of a 40 scale counter as shown in FIG. 4.

As described above, when the second gate circuit 10 produces the output signal $\alpha(-1)$, the first gate circuit 8 inverts the output signal $\theta_6$ from the delay circuit 6 and produces the output signal $\beta$ equal to the inverted signal of $\theta_6$. When $\theta_6$ is 0, an output signal $\theta_1$ is inverted by the output signal $\gamma$ of the exclusive OR circuit 9 receiving $\beta$ and $\theta_1$. On the other hand, when $\theta_6$ is 1, a pulse is counted without inverting the signal $\theta_1$. If the second gate circuit 10 produces the output signal $\alpha(=0)$, irrespective of the logical level of the input signal $\theta_6$ to the first gate circuit 8, $\beta$ becomes 1 and the input signal $\gamma$ to the delay circuit 1 is set at 0 to invert the signal $\theta_1$ and count a pulse. That is, a predetermined number of the second addresses are skipped to carry out the counting operation according to the preset combination of the input to the second gate circuit 10. When the second addresses 39 to 19 are skipped as shown in FIG. 3, first and second addresses change in the following order.

Reset(33) → $t_1$(3) → $t_2$(6) → $t_3$(13) → $t_4$(26) → $t_5$(-53) → $t_6$(43) → $t_7$(23) → $t_8$(46) → $t_9$(28) → $t_{10}$(57)- → $t_{11}$(51) → $t_{12}$(38) → $t_{13}$(12) → $t_{14}$(25) → $t_{15}$(50)- → $t_{16}$(36) → $t_{17}$(8) → $t_{18}$(17) → $t_{19}$(34) → $t_{20}$(4) → $t_{21}$(9) → $t_{22}$(18) → $t_{23}$(37) → $t_{24}$(11) → $t_{25}$(22) → $t_{26}$(45) → $t_{27}$(27) → $t_{28}$(54) → $t_{29}$(44) → $t_{30}$(24) → $t_{31}$(49)- → $t_{32}$(35) → $t_{33}$(7) → $t_{34}$(14) → $t_{35}$(29) → $t_{36}$(58)- → $t_{37}$(52) → $t_{38}$(40) → $t_{39}$(16) → $t_{40}$(33).

As is understood from this, at a first address $t_{40}$, a code 33 of the second address is again reached, that is, the shift register is again set to the initial state and the counting operation is repeated.

FIG. 4 shows a time chart schematically explaining the operation of the counter when it is used as a 40 scale counter. The counter shown in FIG. 1 can also be used as a 63 scale counter by eliminating the second gate circuit 10 from the counter and maintaining the input signal $\alpha$ to the first gate circuit 8 at a level 1. The function of the counter can be explained with reference to a time chart of FIG. 3.

According to this invention, use of X number of delay circuits makes it possible to form an n scale counter satisfying an inequality $2^x \geq n$. The maximum counting capacity of the counter is $2^x-1$. However, a required n scale counter can be formed by connecting the second gate circuit 10 to skip a predetermined number of second addresses as described before. Further, the delay circuits are synchronously operated by clock pulses to be counted and can produce an output pulse having a sufficiently large pulse width which can hardly be obtained in the prior art binary counter. The number of insulated gate field effect transistors to construct the counter is largely reduced. For example, a 40 scale counter can be formed of 90 insulated gate field effect transistors as shown in FIG. 2. When an input clock pulse of, for example, 10 KHz is used, delay circuits can be formed of dynamic type, making it possible to reduce the number of transistors used.

The embodiment has been explained to function on the basis of a negative logic, but can easily be modified to function on the basis of a positive logic. Further, the counter is formed of complementary circuits of n and p channel type insulated gate field effect transistors, but the counter can be formed of n or p channel type insulated gate field effect transistors. A coincident OR circuit can be substituted for the exclusive OR circuit 9 and, in this case, the first and second gate circuits 8 and 10 are arranged to be properly connected to the coincident OR circuit.

Figure 5:
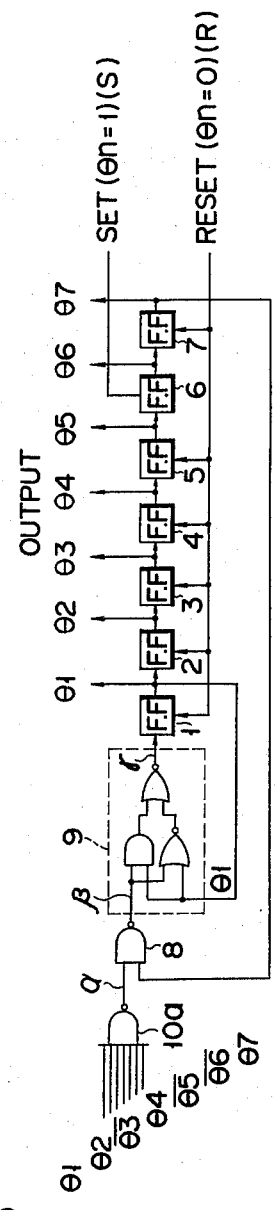
FIG. 5 is a block diagram showing a counter according to a second embodiment of this invention.

A 65 scale counter functioning on the same principle as the counter shown in FIG. 1 is shown in a block diagram in FIG. 5 as a second embodiment. The counter is constituted by seven delay circuits connected in series whose output signals are represented by $\theta_1$ to $\theta_7$. In the initial output state, the signal $\theta_6$ is set at 1 and the remaining signals are set at 0. In order to allow the $127(=2^7-1)$ scale counter to function as a 65 scale counter, a skipping operation may be effected as described in the first embodiment shown in FIG. 1. For this purpose, for example, a combination of input signals to a second gate circuit 10a is determined to be a combination of $(\theta_1, \theta_2, \overline{\theta_3}, \theta_4, \overline{\theta_5}, \overline{\theta_6}, \theta_7)$. Except the points described above, the counter is similar, in construction and function, to that shown in FIG. 1 and so a further explanation about this counter is not made.

Figure 6:
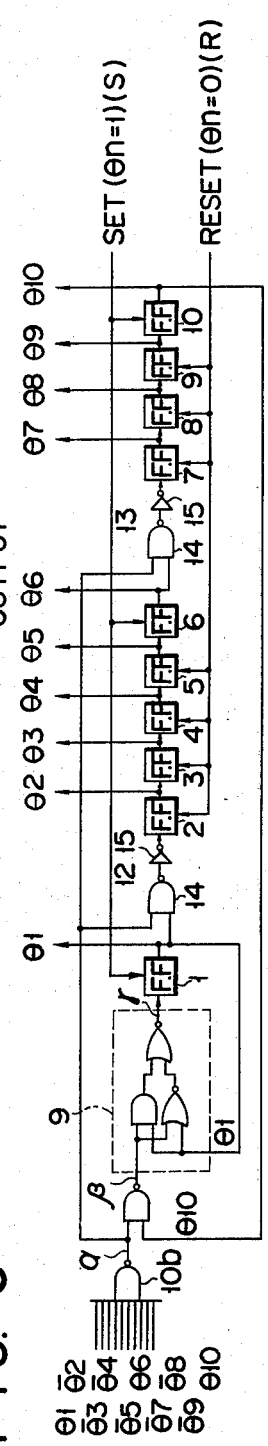
FIG. 6 is a block diagram showing a counter according to a third embodiment of this invention.

FIG. 6 shows a block diagram of a counter according to a third embodiment of this invention. This counter is a 262 scale counter including delay circuits 1 to 10 whose outputs are represented by $\theta_1$ to $\theta_{10}$, respectively. At the initial state, the delay circuits 1, 6, 10 are set to produce output signals of 1 level and the remaining delay circuits 2, 3, 4, 5, 7, 8, 9 are set to produce output signals of 0 level. In the same way as in the counter shown in FIG. 1, the output signal $\theta_1$ of the first stage delay circuit 1 is applied to one terminal of the exclusive OR circuit 9 and the output signal $\theta_{10}$ of the last stage delay circuit 10 is applied to one terminal of the first gate circuit 8. However, since a large number of second addresses may be skipped in the counter shown in FIG. 6, gate circuits 12 and 13, in addition to the first gate 8, are provided between the delay circuits 1 and 2 and between the delay circuits 6 and 7, respectively, so that a suitable skipping operation can be effected. Each of the gate circuits 12 and 13 includes a NAND circuit 14 and an inverter 15 connected in series. The NAND gate 14 of the gate circuit 12 is supplied with the output signal $\theta_1$ at its first input terminal and the output signal $\alpha$ from the second gate circuit 10b at its second input terminal. The NAND gate 14 of the gate circuit 13 is supplied with the output signal $\theta_6$ at its first input terminal and the output signal $\alpha$ from the second gate circuit 10b at its second input terminal. A combination of input signals to the second gate circuit 10b is logically determined to be ($\theta_1$, $\bar{\theta}_2$, $\bar{\theta}_3$, $\bar{\theta}_4$, $\bar{\theta}_5$, $\theta_6$, $\bar{\theta}_7$, $\bar{\theta}_8$ $\bar{\theta}_9$, $\theta_{10}$). This counter functions in substantially the same manner as the counter shown in FIG. 1 and so the operation of the counter is not explained here.

Figure 7:
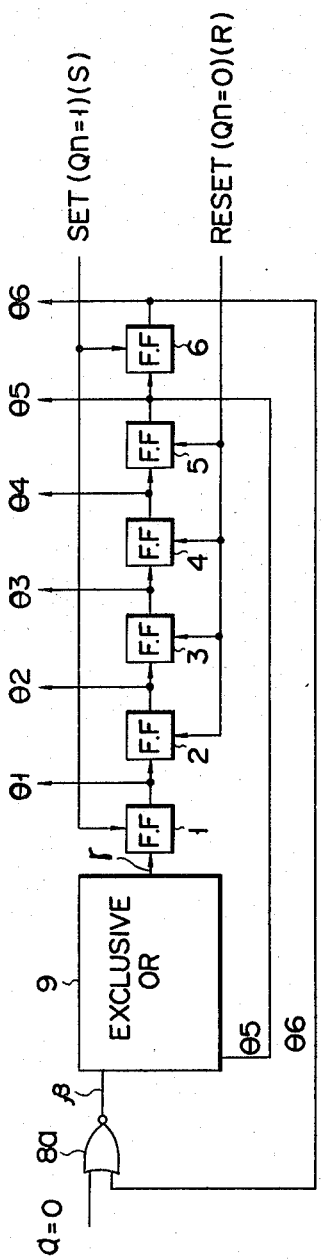
FIG. 7 is a block diagram showing a counter according to a fourth embodiment of this invention.
Figure 8:
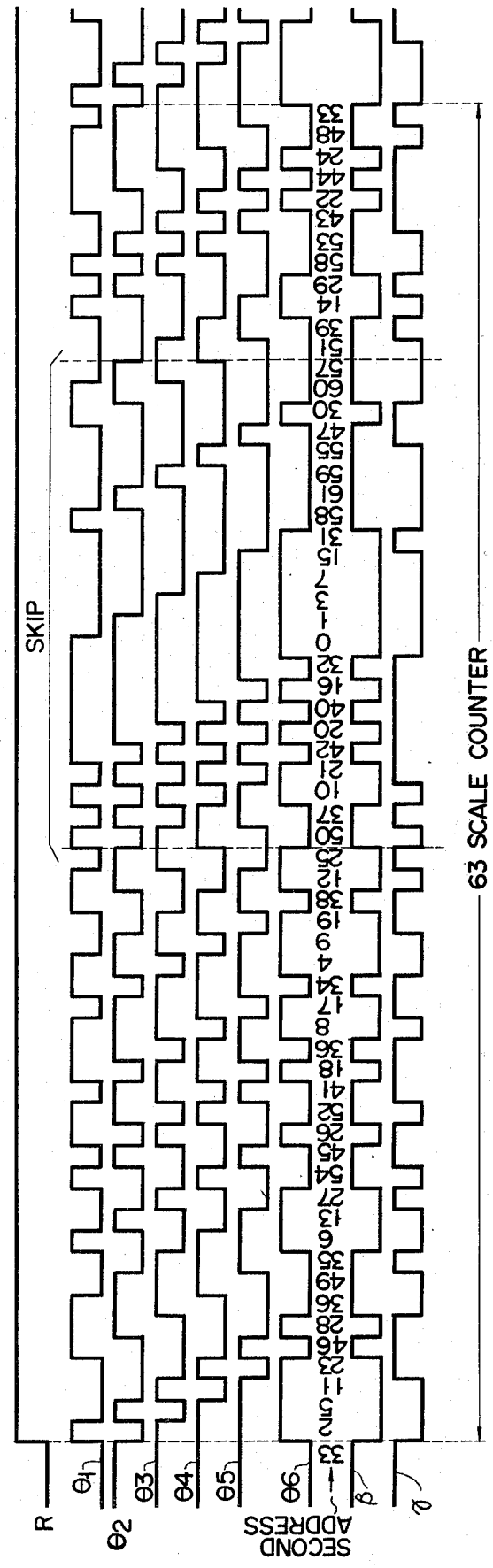
FIG. 8 is a time chart schematically explaining the operation of the counter of FIG. 7 when used as a 63 scale counter.

In the embodiments shown in FIGS. 1, 5 and 6, the output signal $\theta_1$ of the first stage delay circuit 1 is supplied to the exclusive OR circuit 9. In stead of the output signal $\theta_1$, however, an output signal of selected one of the delay circuits except the last stage delay circuit can be supplied to the exclusive OR circuit 9. For example, the output signal $\theta_5$ from the fifth stage delay circuit 5 can be supplied as shown in FIG. 7. The fourth embodiment shown in FIG. 7 is different from the embodiment shown in FIG. 1 in that an output signal $\theta_5$ from the delay circuit 5 is applied to the exclusive OR circuit 9, and the first gate circuit 8 is formed of a NOR circuit 8a which receives the output signal $\theta_6$ from the delay circuit 6 and the signal $\alpha(=0)$ when the counter is required to function as a 63 scale counter. FIG. 8 shows a time chart schematically illustrating the operation of the counter shown in FIG. 7. In FIG. 8, the first addresses are omitted and waveforms of output signals $\theta_1$ to $\theta_6$ are shown corresponding to the second addresses. When the output signal $\theta_6$ is 0, $\beta$ is 1 causing the output signal $\theta_1$ to be inverted, and when the output signal $\theta_6$ is 1, $\beta$ is 0 and the output signal $\theta_6$ is not inverted. This is the same as in the embodiment shown in FIG. 1.

Figure 9:
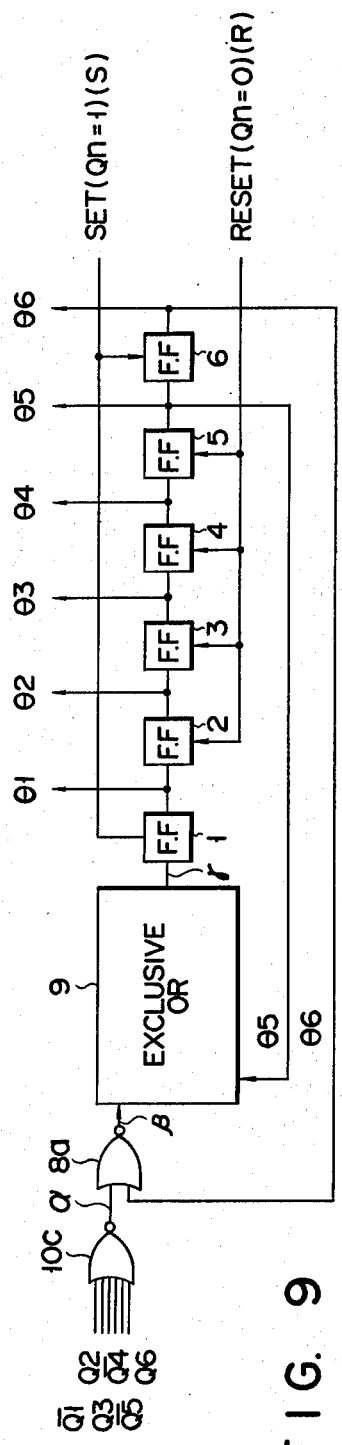
FIG. 9 is a block diagram showing a counter according to a fifth embodiment of this invention.
Figure 10:
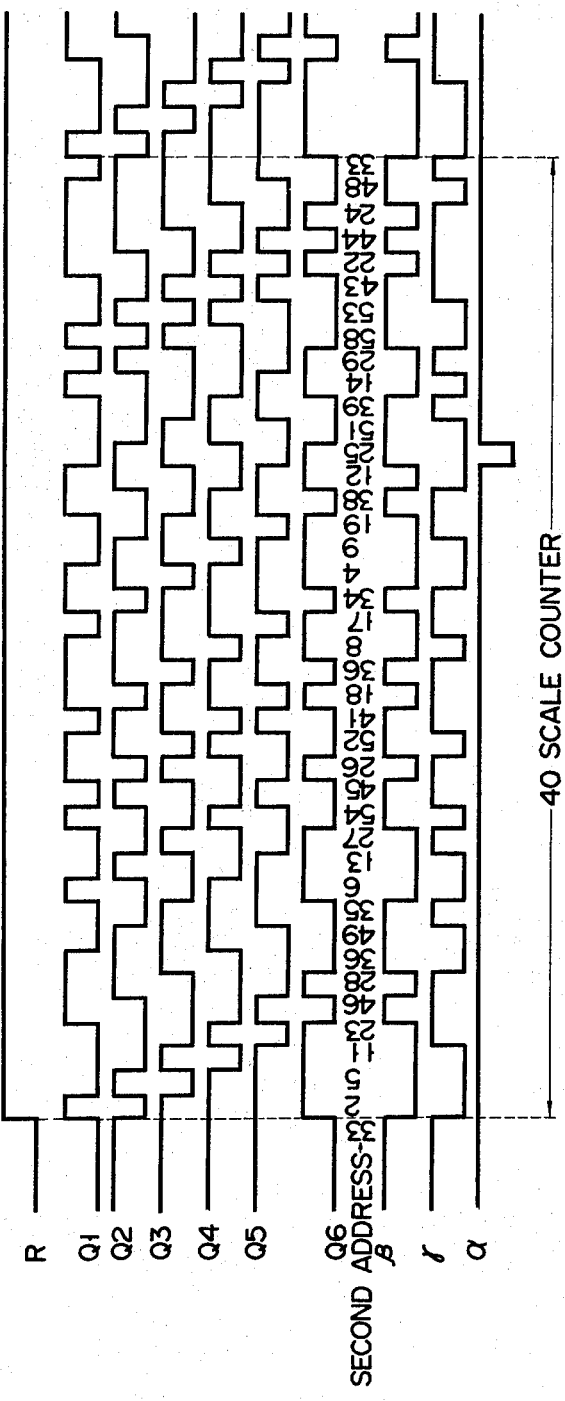
FIG. 10 is a time chart schematically explaining the operation of the counter of FIG. 9 when used as a 40 scale counter.

FIG. 9 shows a fifth embodiment in which the second gate circuit is formed of a NOR circuit 10c whose output signal is supplied to the NOR circuit 8a as the input signal $\alpha$. In order to skip the second addresses 50 to 57 shown in FIG. 8, a combination of input signals to the second gate circuit 10c is determined to be ($\bar{\theta}_1$, $\theta_2$, $\theta_3$, $\bar{\theta}_4$, $\bar{\theta}_5$, $\theta_6$). FIG. 10 shows a time chart schematically explaining the operation of the counter shown in FIG. 9. This time chart is same as the time chart in FIG. 8 except that time chart which corresponds to the second addresses 50 to 57. In this time chart, the first addresses are not shown for clarity.

What we claim is:

1. An n scale counter comprising a shift register having a plurality of unit delay circuits connected in series which are synchronously supplied with pulses to be counted and each provided with a plurality of insulated gate field effect transistors, a set-reset means for setting at least one of said unit delay circuits and resetting the remaining unit delay circuits to set said shift register into the initial state, and a closed loop circuit receiving output signals from the last stage unit delay circuit of said shift register and a selected one of the remaining unit delay circuits and applying to the first stage unit delay circuit an output signal which causes the first stage unit delay circuit to produce an output signal inverted when an output signal of the last stage unit delay circuit is 0 and an output signal which causes the first stage unit delay circuit to produce an output signal non-inverted when an output signal of the last stage unit delay circuit is 1.

2. An n scale counter according to claim 1 wherein said closed loop circuit includes a first gate circuit receiving a signal at a constant level and an output signal of said last stage unit delay circuit and a logic circuit receiving output signals from said first gate circuit and said last stage unit delay circuit to supply to said first stage unit delay circuit a signal indicating coincidence or incoincidence of the output signals received.

3. An n scale counter according to claim 1 wherein said first and last stage unit delay circuits are initially set to produce an output signal 1 and the remaining unit delay circuits are initially set to produce an output signal 0, and said closed loop circuit includes a NAND gate circuit receiving a signal at 1 level and an output signal from said last stage unit delay circuit and an exclusive OR circuit receiving output signals from said NAND gate circuit and said first stage unit delay circuit to supply to the first unit delay circuit a signal indicating coincidence or incoincidence of the output signals received.

4. An n scale counter according to claim 1 wherein the last stage unit delay circuit and its preceding stage unit delay circuit are initially set to produce an output signal of 1 and the remaining unit delay circuits are initially set to produce an output signal of 0, and said closed loop circuit includes a NAND gate circuit receiving a signal at 1 level and an output signal from the last stage unit delay circuit and an exclusive OR circuit receiving output signals from said NAND gate circuit and said first stage unit delay circuit to supply to said first stage unit delay circuit a signal indicating coincidence or incoincidence of the output signals received.

5. An n scale counter according to claim 1 wherein said first and last unit delay circuits are initially set to produce an output signal 1 and the remaining unit delay circuits are initially set to produce an output signal 0, and said closed loop circuit includes NOR gate receiving a signal at 0 level and an output signal from the last stage unit delay circuit and an exclusive OR circuit receiving output signals from said NOR gate circuit and the delay circuit just preceding said last stage unit delay circuit to supply to said first stage unit delay circuit a signal indicating coincidence or incoincidence of the output signals received.

6. An n scale counter comprising a shift register having a plurality of unit delay circuits connected in series which are synchronously supplied with pulses to be counted and are each provided with a plurality of insulated gate field effect transistors, a set-reset means for setting at least one of said unit delay circuits and resetting the remaining unit delay circuits to set said shift register into the initial state, and a closed loop circuit receiving output signals from the last stage unit delay circuit of said shift register and a selected one of the remaining unit delay circuits and produces an output signal to the first stage unit delay circuit, said closed loop circuit including a second gate circuit receiving output signals from said unit delay circuits in a predetermined combination, a first gate circuit receiving output signals from said second gate circuit and said last stage unit delay circuits and a logic circuit receiving output signals from said first gate circuit and said selected one of the unit delay circuits to supply to said first stage unit delay circuit a signal indicating coincidence or incoincidence of the outputs received.

7. An n scale counter according to claim 6 wherein said first and second gate circuits are NAND gate circuits and said logic circuit is an exclusive OR circuit.

8. An n scale counter according to claim 6 wherein said first and second gate circuits are NOR gate circuits and said logic circuit is an exclusive OR circuit.

* * * * *